(12) United States Patent
Edelstein

(10) Patent No.: US 7,655,996 B1
(45) Date of Patent: Feb. 2, 2010

(54) MEMS STRUCTURE SUPPORT AND RELEASE MECHANISM

(75) Inventor: Alan S. Edelstein, Alexandria, VA (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 323 days.

(21) Appl. No.: 11/345,542

(22) Filed: Feb. 2, 2006

Related U.S. Application Data

(60) Provisional application No. 60/650,000, filed on Feb. 3, 2005.

(51) Int. Cl.
*H01L 29/84* (2006.01)
(52) U.S. Cl. .................. 257/415; 257/595; 257/602; 257/E29.324
(58) Field of Classification Search .......... 257/415, 257/595, 600, 602, E29.324
See application file for complete search history.

(56) References Cited

U.S. PATENT DOCUMENTS

| 6,337,027 | B1 | 1/2002 | Humphrey |
| 6,426,237 | B2 | 7/2002 | Jech, Jr. et al. |
| 6,535,663 | B1 | 3/2003 | Chertkow |
| 6,594,059 | B2 | 7/2003 | Flanders |
| 6,600,850 | B1 | 7/2003 | Fan |
| 6,734,512 | B2 * | 5/2004 | Suzuki ................. 257/414 |
| 6,787,438 | B1 * | 9/2004 | Nelson ................. 438/584 |
| 6,838,304 | B2 | 1/2005 | Ikeda et al. |
| 6,861,277 | B1 | 3/2005 | Monroe et al. |
| 6,946,315 | B2 | 9/2005 | Ikeda et al. |
| 7,101,724 | B2 * | 9/2006 | Chou ................... 438/48 |
| 2003/0119221 | A1 * | 6/2003 | Cunningham et al. ...... 438/52 |

\* cited by examiner

*Primary Examiner*—Matthew E Warren
(74) *Attorney, Agent, or Firm*—Edward L. Stolarun; Lawrence E. Anderson

(57) ABSTRACT

A MEMS device and method comprising a MEMS structure adjacent to a SOI base; a sacrificial support operatively connecting the base to the MEMS structure; a suspension member operatively connecting the base to the MEMS structure, wherein the suspension member is longer than the sacrificial support; and an electrode operatively connected to the base. The device may further comprise a current pulse generator adapted to send a current pulse through the sacrificial support, wherein the current pulse causes the sacrificial support to detach from the MEMS structure. Moreover, the sacrificial support structures may be electrically resistive.

13 Claims, 3 Drawing Sheets

MEMS STRUCTURE SUPPORT AND RELEASE MECHANISM

CROSS-REFERENCE TO RELATED APPLICATIONS

This application claims the benefit of U.S. Provisional Patent Application No. 60/650,000 filed on Feb. 3, 2005, the complete disclosure of which, in its entirety, is herein incorporated by reference.

GOVERNMENT INTEREST

The embodiments described herein may be manufactured, used, and/or licensed by or for the United States Government without the payment of royalties thereon.

BACKGROUND

1. Field of the Invention

The embodiments herein generally relate to microelectromechanical systems (MEMS) and, more particularly, to support mechanisms for MEMS devices.

2. Description of the Related Art

Some MEMS structures such as accelerometers include flexible springs with very low spring constants. Large accelerations can tend to damage or destroy the device. Thus, it is desirable that these structures be protected from large accelerations prior to deployment. One method for coping with this problem is to support the MEMS structure with permanent silicon supports. However, this method of protection has the disadvantage that the structure may still be unprotected in the time interval between the end of fabrication and deployment. For example, suppose the MEMS structure is going to be used after being fired from a cannon. The acceleration the MEMS structure experiences in being fired from a cannon may destroy the MEMS structure. Accordingly, there remains a need for a novel technique of protecting MEMS structures prior to deployment.

SUMMARY

In view of the foregoing, an embodiment herein provides a device comprising a base; a MEMS structure adjacent to the base; a plurality of sacrificial support structures operatively connecting the base to the MEMS structure; a suspension member operatively connecting the base to the MEMS structure, wherein the suspension member is longer than each of the plurality of sacrificial support structures; and an electrode operatively connected to the base. Preferably, the base comprises a silicon on insulator (SOI) wafer. The sacrificial support structures may be electrically resistive. Additionally, the device may further comprise a capacitor operatively connected to the sacrificial support structures, wherein the capacitor is adapted to release energy to the sacrificial support structures, and wherein the released energy causes the sacrificial support structures to detach from the MEMS structure. Furthermore, the device may further comprise a current pulse generator adapted to send a current pulse through the sacrificial support structures, wherein the current pulse causes the sacrificial support structures to detach from the MEMS structure. Preferably, the sacrificial support structures comprise a higher electrical resistivity than any of the base, the MEMS structure, the suspension member, and the electrode.

Another embodiment provides a system comprising a base; a MEMS structure proximate to the base; at least one sacrificial support operatively connecting the base to the MEMS structure; a suspension member operatively connected to the MEMS structure; at least one electrode operatively connected to the base; and a current pulse generator adapted to send a current pulse through the sacrificial support. Preferably, the base comprises a SOI wafer operatively connected to the MEMS structure. The sacrificial support may be electrically resistive. Also, the current pulse generator may comprise a capacitor operatively connected to the sacrificial support, wherein the capacitor is adapted to release energy to the sacrificial support, and wherein the released energy causes the sacrificial support to detach from the MEMS structure. Preferably, the current pulse causes the sacrificial support to detach from the MEMS structure. Moreover, the sacrificial support preferably comprises a higher electrical resistivity than any of the base, the MEMS structure, the suspension member, and the electrode.

Another embodiment provides a method of releasing a MEMS structure from a base, wherein the method comprises operatively connecting the base to the MEMS structure using at least one sacrificial support; and sending a current pulse through the sacrificial support, wherein the current pulse causes the sacrificial support to detach from the MEMS structure. The method may further comprise operatively connecting a capacitor to the sacrificial support, wherein the capacitor is adapted to release energy to the sacrificial support, and wherein the released energy causes the sacrificial support to burn.

Another embodiment provides a method comprising providing a base; positioning a MEMS structure proximate to the base; operatively connecting the base to the MEMS structure using a sacrificial support structure; operatively connecting a suspension member to the MEMS structure, wherein the suspension member is longer than the sacrificial support structure; and operatively connecting an electrode to the base. Preferably, the base comprises a SOI wafer. The method may further comprise configuring the sacrificial support structure to be electrically resistive. Moreover, the method may further comprise operatively connecting a capacitor to the sacrificial support structure, wherein the capacitor is adapted to release energy to the sacrificial support structure, and wherein the released energy causes the sacrificial support structure to detach from the MEMS structure. Alternatively, the method may further comprise sending a current pulse through the sacrificial support structure, wherein the current pulse causes the sacrificial support structure to detach from the MEMS structure. Furthermore, the sacrificial support structure is preferably configured to comprise a higher electrical resistivity than any of the base, the MEMS structure, the suspension member, and the electrode.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

Figure 1:
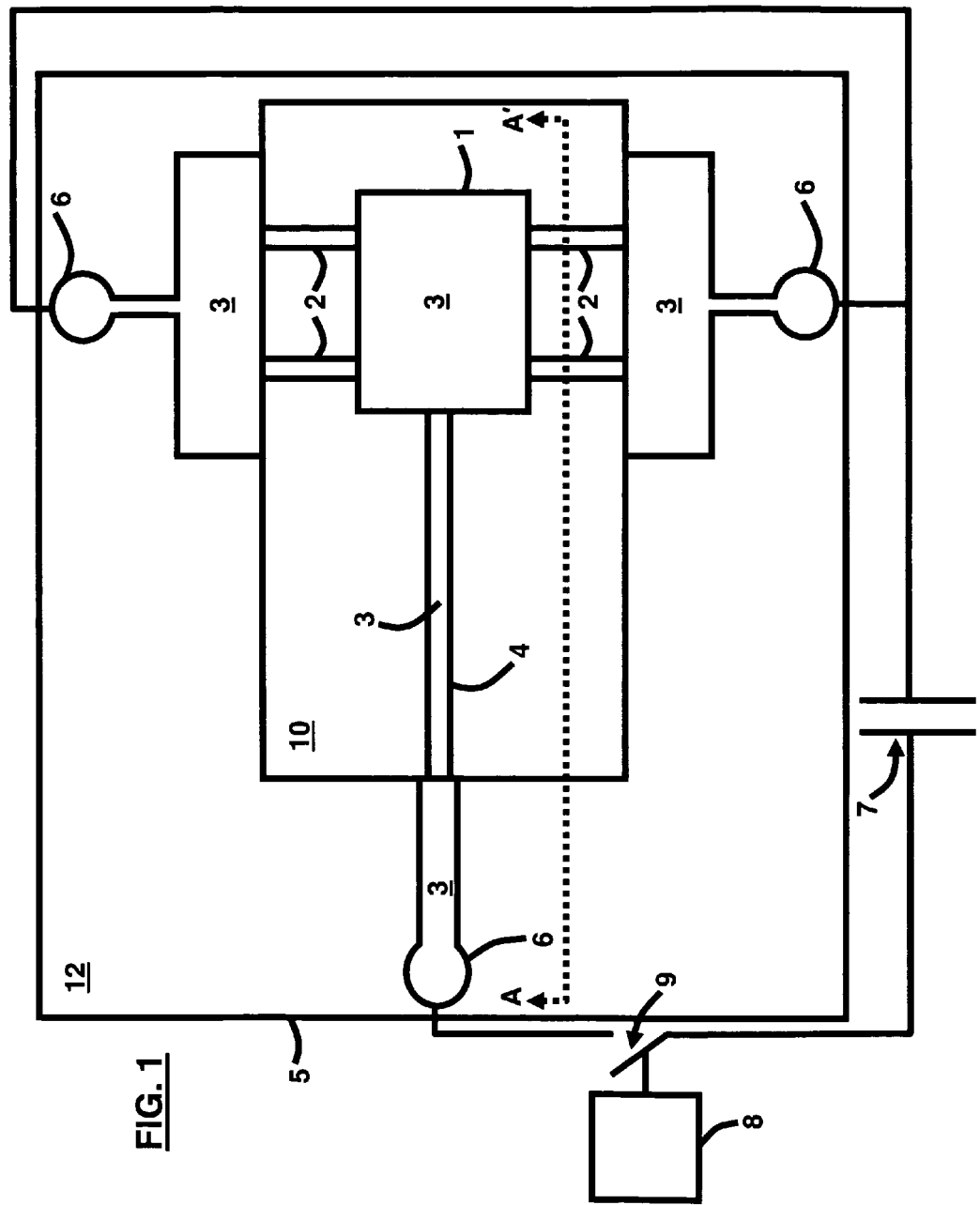
FIG. 1 illustrates a schematic diagram of a system according to an embodiment herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned, there remains a need for a novel technique of protecting MEMS structures prior to deployment. The embodiments herein achieve this by using thin, sacrificial, relatively high electrically resistant supports to protect such MEMS structures prior to deployment. Upon deployment a current pulse is passed through the support to break the support and release the MEMS structure. Referring now to the drawings, and in particular to FIGS. 1 through 3(B), where similar reference characters denote corresponding features consistently throughout the figures, there are shown preferred embodiments herein.

Figure 2:
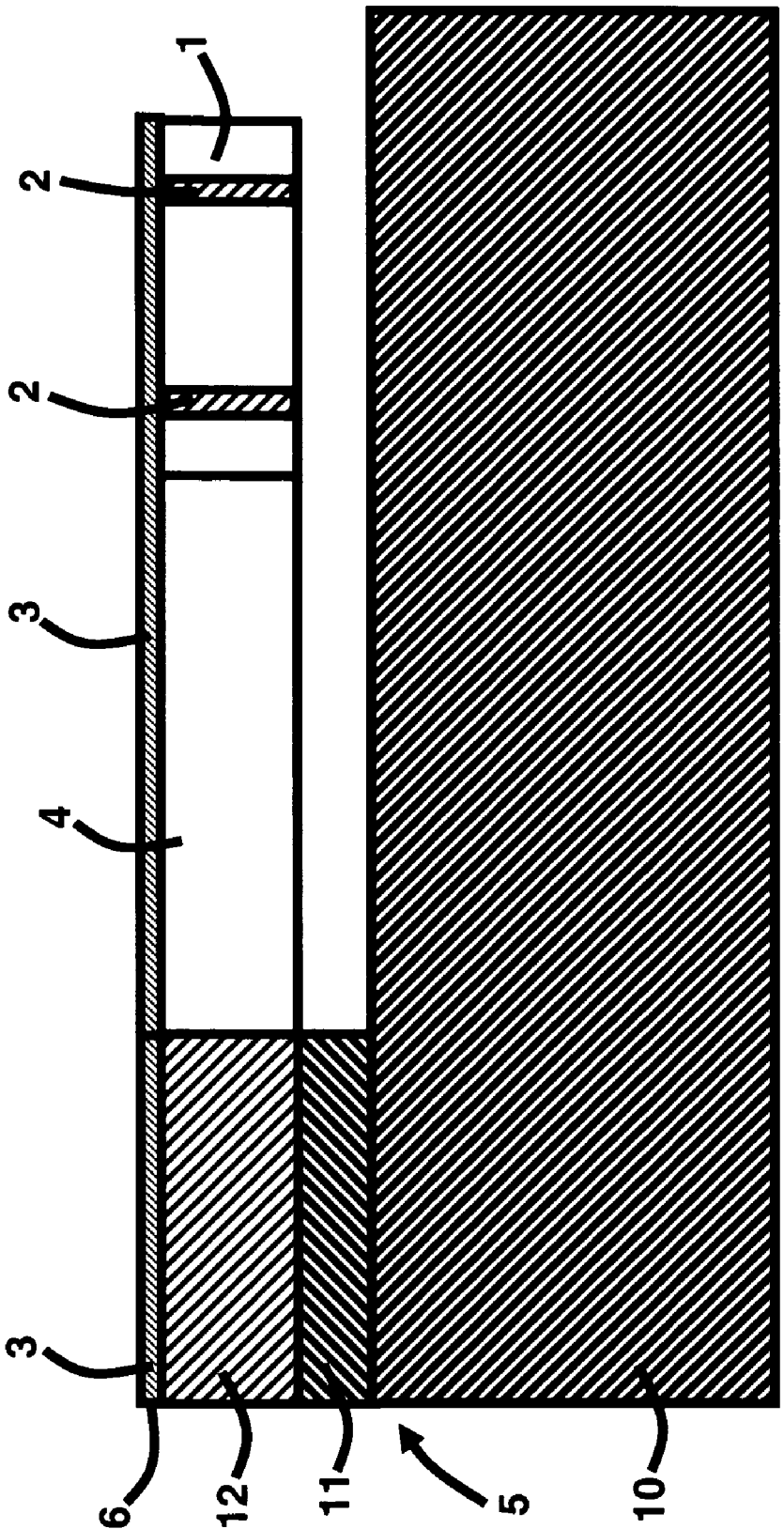
FIG. 2 illustrates a cross-sectional schematic diagram of the system of FIG. 1 cut along line A-A' of FIG. 1 according to an embodiment herein.

FIGS. 1 and 2 illustrate a preferred embodiment. The MEMS structure 1 is supported to a base 5 by a long cantilever 4 and conducting supports 2. The supports 2 have a higher electrical resistance than the other regions in FIGS. 1 and 2. Moreover, the supports 2 are much shorter in length than the cantilever 4. In some applications, the cantilever 4 may be replaced by a long resilient member such as a spring or a torsion suspension.

The following describes an example in which the embodiments herein could be fabricated. The process begins by starting with a base 5, preferably embodied as a SOI wafer. The base 5 preferably comprises a silicon device layer 12 over a silicon dioxide layer 11 over a handle layer 10. The resistivity of the device layer 12 should preferably be approximately 0.1 ohm cm. The thickness of the device layer 12 is approximately 3-5 microns thick. Moreover, the device 12 and handle 10 layers are preferably bonded to each other using well-known techniques. Next, any necessary devices, such as a magnetic sensor or a radioactive power source (not shown), for example, are deposited on what will be the MEMS structure 1 and/or elsewhere on the surface of the device layer 12. Then, the MEMS structure 1 is preferably defined using standard lithography techniques. Thereafter, the process involves using a deep reactive ion etching (DRIE) process to remove the unwanted portions of the device layer 12. If necessary, one can also remove unwanted portions of the handle layer 10 by DRIE. Next, electrodes 6, preferably comprising gold, are deposited and the appropriate suspension members 4 are covered, for example, the long cantilever 4 is covered with gold 3. Finally, the MEMS structure 1 is released from the handle layer 10 by immersion in hydrofluoric (HF) solution and using critical point drying.

Preferably, the supports 2 comprise silicon and are fabricated by using a DRIE process on the device layer 12. The supports 2 are connected to the MEMS structure 1 and the device layer 12 as shown in FIG. 1. Thus, the supports 2 tend to prevent the motion of the MEMS structure 1. Because the supports 2 are relatively short (compared with length of the cantilever 4), they will not bend very much if the base 5 is subject to acceleration. This protects the MEMS structure 1 from undergoing large displacements that may damage the device when the base 5 is accelerated. Preferably, the supports 2 and cantilever 4 are formed of silicon and are configured using conventional MEMS fabrication techniques such as DRIE.

When the MEMS structure 1 is deployed and it is necessary for the MEMS structure 1 to move more freely, a current pulse is applied between the electrodes 6. The current pulse heats the conducting supports 2 to a sufficiently high temperature such that they will be destroyed. For silicon, the melting temperature is approximately 1,410° C. and the boiling temperature is approximately 2,680° C. As the supports 2 heat up, their resistance increases. The heating also decreases their aerial cross-section which also increases their resistance. Both of these effects can increase the heating until the electrical path is destroyed. The length of the supports 2 should preferably be sufficiently configured such that after they are burned, sufficient clearance is provided for the MEMS structure 1 to move freely. Moreover, the length of the supports 2 should preferably be sufficiently configured such that they do not leave too much debris. Accordingly, the length of the supports 2 should be approximately 5-100 microns each depending on the type of MEMS structure 1 to be supported. The width of each support 2 is approximately 0.1-10 microns. The thickness of the support 2 is approximately 1-20 microns. Moreover, the supports 2 have an approximate conductivity of 0.1 ohm cm.

In order to estimate the power required to vaporize the supports 2, it is assumed (1) that the current pulse is applied sufficiently quickly that one can ignore the heat carried away by convection; and (2) that the support 2 is approximately 10 microns long, 3 microns wide, and 3 microns thick. Accordingly, the amount of material to be vaporized is calculated to be approximately 90 micron$^3$ or $9 \times 10^{-11}$ cm$^3$ and has a mass of approximately $2 \times 10^{-10}$ g. The energy, $E_1$, required to heat the material of the supports 2 to a boiling point of 3,200K is $E_1$=Specific heat×temperature difference×mass=1 J/g K×3.5×10$^{-10}$×2,900 K=7×10$^{-7}$ J. The energy, $E_2$, required to evaporate the silicon=heat of vaporization×mass=40 k cal/g-atom×4,200 J/cal×2×10$^{-10}$ g/28 atomic number=4×10$^4$ cal× 4.2 10$^3$ J/cal 1.2×10$^{-11}$ moles=1.3×10$^{-3}$ J. Thus, the total energy required to vaporize the support 2 is approximately 1.3×10$^{-3}$ J.

The resistivity of each support 2 is approximately 1,000 ohms. In one embodiment, a capacitor 7 is discharged in order to vaporize the support 2. The energy stored in the capacitor 7 is $CV^2/2$ where C is in farads, V is in volts and the energy is in Joules. For example, if a 100 microfarad capacitor is used, then the voltage required to store 1.3×10$^{-3}$ J is 5 volts. The time constant for dissipating this energy in a support is RC or 0.1 sec. The capacitor 7 may be attached to the electrodes 6 by wire bonding, thereby being operatively connected to the supports 2. One consideration with respect to the embodiments herein is getting the current to the MEMS structure 1 without dissipating too much energy anywhere except in the supports 2. Accordingly, the embodiments herein provide a resistance path to the MEMS structure 1 that is considerably smaller than 1,000 ohms. For example, this resistance path may be approximately 1 mm long and 10 microns wide in order for its resistance to be 100 ohms, and the support 2 is preferably coated with approximately 200 nm of gold 3 in order to achieve this resistance.

The capacitor 7 or other pulse current source can be initiated by a variety of initiating means 8 and triggering means 9. For example, the initiating means 8 may comprise a controller that may operate the triggering means 9, which may be embodied as a switch to provide the means for sending the pulse current to the supports 2. In another example, the initiating means 8 may comprise a transmitter/receiver device adapted to receive a radio signal sent from a remote source that could activate the triggering means 9, which may be embodied as a solenoid. Whatever method is used, the current pulse serves to burn out the supports 2. Alternative embodiments to create the low resistivity regions include doping or ion implantation. Preferably, the silicon device layer 12 is not too thick (i.e., approximately 3-5 microns) such that the resistivity of the conducting supports 2 are not too low and the amount of material that must be removed (i.e., burned out) is not too large.

Figure 3B:
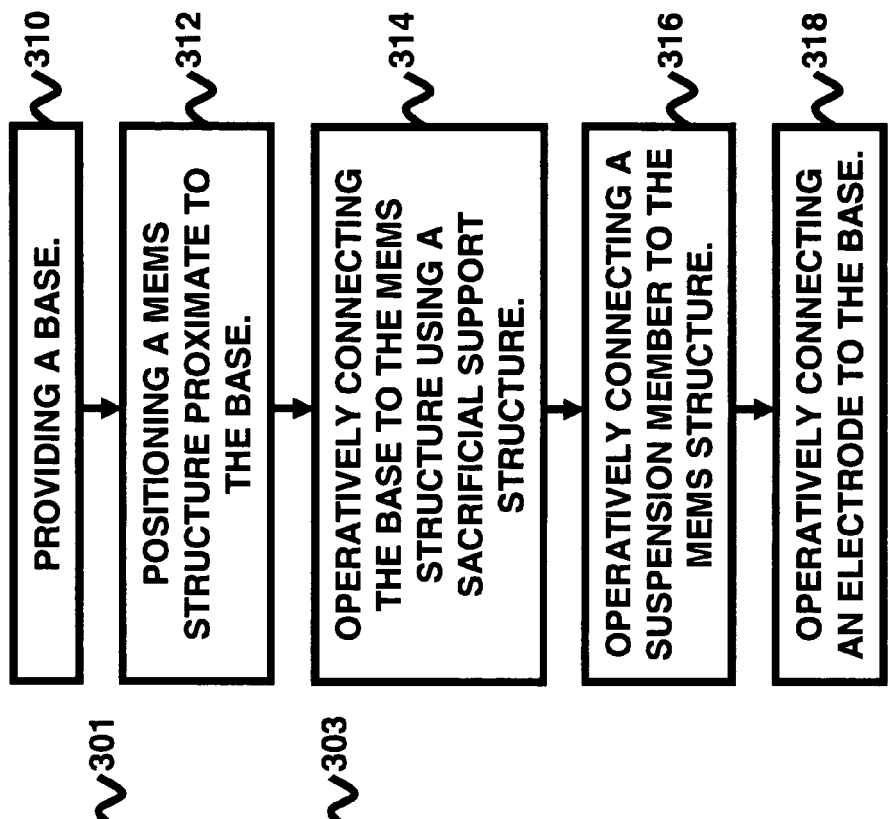
FIGS. 3(A) and 3(B) are flow diagrams illustrating preferred methods according to the embodiments herein.
Figure 3A:
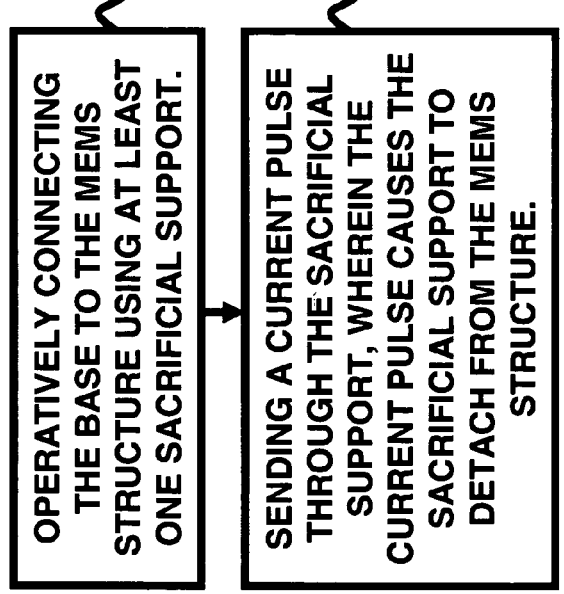

FIG. 3(A) (with reference to FIGS. 1 and 2) illustrates a flow diagram of a method of releasing a MEMS structure 1 from a base 5, wherein the method comprises operatively connecting (301) the base 5 to the MEMS structure 1 using at least one sacrificial support 2; and sending (303) a current pulse through the sacrificial support 2, wherein the current pulse causes the sacrificial support 2 to detach from the MEMS structure 1. The method may further comprise operatively connecting a capacitor 7 to the sacrificial support 2, wherein the capacitor 7 is adapted to release energy to the sacrificial support 2, and wherein the released energy causes the sacrificial support 2 to burn.

FIG. 3(B) (with reference to FIGS. 1 and 2) illustrates a flow diagram of a method comprising providing (310) a base 5; positioning (312) a MEMS structure 1 proximate to the base 5; operatively connecting (314) the base 5 to the MEMS structure 1 using a sacrificial support structure 2; operatively connecting (316) a suspension member 4 to the MEMS structure 1, wherein the suspension member 4 is longer than the sacrificial support structure 2; and operatively connecting (318) an electrode 6 to the base 5. Preferably, the base 5 comprises a SOI wafer.

The method may further comprise configuring the sacrificial support structure 2 to be electrically resistive based on the material properties of the silicon used to form the supports 2. Moreover, the method may further comprise operatively connecting a capacitor 7 to the sacrificial support structure 2, wherein the capacitor 7 is adapted to release energy to the sacrificial support structure 2, and wherein the released energy causes the sacrificial support structure 2 to detach from the MEMS structure 1. Alternatively, the method may further comprise sending a current pulse through the sacrificial support structure 2, wherein the current pulse causes the sacrificial support structure 2 to detach from the MEMS structure 1. Furthermore, the sacrificial support structure 2 is preferably configured to comprise a higher electrical resistivity than any of the base 5, the MEMS structure 1, the suspension member 4, and the electrode 6. Furthermore, the top of the sacrificial support structure 2 may have a lower electrical resistance than the rest of the support structure 2. This may be accomplished by depositing a lower electrical resistance material on the top surface. For example, the lower electrical resistance material may be a thin layer of a metal.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A device comprising:
   a base;
   a microelectromechanical system (MEMS) structure adjacent to said base;
   at least one removable sacrificial support structure operatively connecting said base to said MEMS structure for restricting movement of said MEMS structure relative to said base;
   a suspension member operatively connecting said base to said MEMS structure, wherein said suspension member is configured to permit movement of the MEMS structure relative to the base; and
   an electrode operatively connected to said base for conducting a current which causes said at least one sacrificial support structure to disconnect and allow the MEMS structure to move relative to said base.

2. The device of claim 1, all the limitations of which are hereby incorporated by reference, wherein said base comprises a silicon on insulator (SOI) wafer, and said at least one sacrificial support structure and said suspension member are formed of silicon.

3. The device of claim 1, all the limitations of which are hereby incorporated by reference, wherein said at least one sacrificial support structure is electrically resistive; and wherein said device is adapted to withstand external forces during transport due to the presence of said at least one sacrificial support structure which prevents destructive movement of said MEMS structure relative to said base; and said MEMS structure is adapted to move freely when said at least one sacrificial support structure is subjected to a current so as to become heated and separate, to thereby permit motion of said MEMS structure to occur when said device is ready to be used.

4. A device comprising:
   a base;
   a microelectromechanical system (MEMS) structure adjacent to said base;
   at least one removable sacrificial support structure operatively connecting said base to said MEMS structure for restricting movement of said MEMS structure relative to said base;
   a suspension member operatively connecting said base to said MEMS structure, wherein said suspension member is configured to permit movement of the MEMS structure relative to the base;
   a capacitor operatively connected to said at least one sacrificial support structure, wherein said capacitor is adapted to release energy to said at least one sacrificial support structure, and
   an electrode operatively connected to said base for conducting a current from said capacitor which causes said at least one sacrificial support structure to disconnect from said MEMS structure and allow the MEMS structure to move relative to said base.

5. The device of claim 1, all the limitations of which are hereby incorporated by reference, further comprising a current pulse generator adapted to send a current pulse through said at least one sacrificial support structure.

6. The device of claim 2, all the limitations of which are hereby incorporated by reference, wherein the process of fabricating said suspension member and said at least one sacrificial support member comprises deep reactive-ion etching (DRIE), said suspension member configured as a cantilever and said at least one sacrificial support structure configured to support and restrict movement of said cantilever relative to said base, whereby upon application of a sufficient current said at least one sacrificial support structure is no longer supportive of cantilever to thereby allow movement of said MEMS structure relative to said base.

7. The device of claim 1, all the limitations of which are hereby incorporated by reference, wherein said device is adapted to be subjected to acceleration and said at least one sacrificial support structure prevents said MEMS structure from undergoing large displacements that may cause damage during acceleration, said at least one sacrificial support structure comprise a higher electrical resistivity than any of said base, said MEMS structure, said suspension member, and said electrode, such that when said MEMS structure is deployed and it is necessary for said MEMS structure to move more freely, a current is applied to said at least one sacrificial support structure which heats said sacrificial support structure until separation occurs and the electrical path is destroyed, said at least one sacrificial support structure being configured such that when said the electrical path is destroyed sufficient clearance is provided for the MEMS structure to move freely relative to said base.

8. A system comprising:
   a base;
   a microelectromechanical system (MEMS) structure proximate to said base;
   at least one sacrificial support operatively connecting said base to said MEMS structure;
   a suspension member operatively connected to said MEMS structure;
   at least one electrode operatively connected to said base; and
   a current pulse generator adapted to send a current pulse through said sacrificial support.

9. The system of claim 8, all the limitations of which are hereby incorporated by reference, wherein said base comprises a silicon on insulator (SOI) wafer operatively connected to said MEMS structure.

10. The system of claim 8, all the limitations of which are hereby incorporated by reference, wherein said sacrificial support structures are electrically resistive.

11. The system of claim 8, all the limitations of which are hereby incorporated by reference, wherein said current pulse causes said sacrificial support to detach from said MEMS structure.

12. The system of claim 8, all the limitations of which are hereby incorporated by reference, wherein said sacrificial support comprises a higher electrical resistivity than any of said base, said MEMS structure, said suspension member, and said electrode.

13. A system comprising:
   a base;
   a microelectromechanical system (MEMS) structure proximate to said base;
   at least one sacrificial support operatively connecting said base to said MEMS structure;
   a suspension member operatively connected to said MEMS structure;
   at least one electrode operatively connected to said base; and
   a current pulse generator adapted to send a current pulse through said sacrificial support;
   wherein said current pulse generator comprises a capacitor operatively connected to said sacrificial support, wherein said capacitor is adapted to release energy to said sacrificial support, and wherein the released energy causes said sacrificial support to detach from said MEMS structure.

* * * * *